United States Patent
Zarrabi

(10) Patent No.: US 11,303,107 B2
(45) Date of Patent: Apr. 12, 2022

(54) APPARATUS AND METHOD FOR DETECTING CURRENT OVERLOAD AND LEAKAGE IN A TRANSPORT REFRIGERATION UNIT

(71) Applicant: Carrier Corporation, Palm Beach Gardens, FL (US)

(72) Inventor: Jamal Zarrabi, Les Andelys (FR)

(73) Assignee: CARRIER CORPORATION, Palm Beach Gardens, FL (US)

( * ) Notice: Subject to any disclaimer, the term of this patent is extended or adjusted under 35 U.S.C. 154(b) by 280 days.

(21) Appl. No.: 16/488,832

(22) PCT Filed: Feb. 28, 2017

(86) PCT No.: PCT/IB2017/000289
§ 371 (c)(1),
(2) Date: Aug. 26, 2019

(87) PCT Pub. No.: WO2018/158602
PCT Pub. Date: Sep. 7, 2018

(65) Prior Publication Data
US 2021/0281064 A1 Sep. 9, 2021

(51) Int. Cl.
| | |
|---|---|
| *H02H 3/08* | (2006.01) |
| *G01R 31/52* | (2020.01) |
| *H02H 1/00* | (2006.01) |
| *H02H 7/06* | (2006.01) |
| *B60H 1/00* | (2006.01) |

(52) U.S. Cl.
CPC .......... *H02H 3/08* (2013.01); *H02H 1/0007* (2013.01); *H02H 7/06* (2013.01); *B60H 1/00278* (2013.01); *G01R 31/52* (2020.01)

(58) Field of Classification Search
CPC ........ H02H 7/06; H02H 1/0007; G01R 31/52; B60H 1/00278
See application file for complete search history.

(56) References Cited

U.S. PATENT DOCUMENTS 5,172,561 A 12/1992 Hanson et al.
5,831,807 A 11/1998 Masannek et al.
(Continued)

OTHER PUBLICATIONS

International Search Report and Written Opinion for application PCT/IB2017/000289, dated Oct. 27, 2017, 10 pages.
(Continued)

*Primary Examiner* — Scott Bauer
(74) *Attorney, Agent, or Firm* — Cantor Colburn LLP

(57) ABSTRACT

A system and method for detecting current overload and leakage in a transport refrigeration unit. The method comprises measuring, by a microcontroller of an active fault detection circuit, a line current for each of one or more phases supplying power to a GP load of a refrigerant vapor compression system of the transport refrigeration unit; measuring, by the microcontroller, a voltage received by the active fault detection circuit from a battery of the transport refrigeration unit and transmitted via a conductor of the active fault detection circuit to a microprocessor of the refrigerant vapor compression system; controlling, by the microcontroller, a switch along the conductor of the active fault detection circuit to control transmission of the voltage, via the conductor to the microprocessor, Controlling the switch comprises (i) closing the switch upon a determination that the voltage level is greater than or equal to an operational threshold voltage level, (ii) closing the switch upon a determination that the voltage level is less than the operational threshold voltage level, and (iii) opening the switch upon a determination that any of the one or more line currents exceeds a threshold. Other embodiments are described herein.

7 Claims, 8 Drawing Sheets

(56) References Cited

U.S. PATENT DOCUMENTS

| | | | |
|---|---|---|---|
| 6,130,487 A | 10/2000 | Bertalan et al. | |
| 6,216,479 B1 | 4/2001 | Elwood | |
| 6,336,593 B1 | 1/2002 | Bhatnagar | |
| 6,471,486 B1 | 10/2002 | Centers et al. | |
| 6,570,363 B2* | 5/2003 | Boberschmidt | A61N 1/3787 |
| | | | 320/122 |
| 7,421,850 B2 | 9/2008 | Street et al. | |
| 7,648,342 B2 | 1/2010 | Jayanth | |
| 8,393,169 B2 | 3/2013 | Pham | |
| 8,590,325 B2 | 11/2013 | Pham | |
| 8,964,338 B2 | 2/2015 | Wallis et al. | |
| 9,121,407 B2 | 9/2015 | Pham | |
| 2012/0086402 A1* | 4/2012 | Carder | H02J 7/34 |
| | | | 320/118 |
| 2013/0234504 A1 | 9/2013 | Morita | |
| 2013/0342948 A1 | 12/2013 | Jankowski et al. | |
| 2014/0115400 A1 | 4/2014 | Moon et al. | |
| 2014/0144164 A1 | 5/2014 | Steele et al. | |
| 2015/0349519 A1 | 12/2015 | Li et al. | |
| 2016/0322859 A1* | 11/2016 | Yamamoto | H02J 7/0022 |

OTHER PUBLICATIONS

Kingtec Canda, "Kingtec K598DE Diesel Transport Refrigeration Unit", available at: http://www.kingtec-canada.com/diesel-driven/k598de-diesel/, 2019, 4 pages.

\* cited by examiner

| INPUT CONDITION | | | | RUN MODE OF OPERATION | | OUTPUT RESULT | | | |
|---|---|---|---|---|---|---|---|---|---|
| S+ STATE | OVERLOAD DETECTED | LEAKAGE DETECTED | VERTM | S+ STATE | S- STATE | LEAKAGE INDICATOR | OVERAGE INDICATOR | SOURCE V PRESENT? | UNIT STATE |
| OK | NO | NO | 12V | CLOSE | CLOSE | OFF | OFF | YES | RUN |
| OK | NO | YES | 12V | OPEN | CLOSE | ON | OFF | NO | FAULT/STOP |
| OK | YES | NO | 12V | OPEN | CLOSE | OFF | ON | NO | FAULT/STOP |
| BAD | NO | NO | 12V | BROKEN | CLOSE | ON | ON | YES | RUN |
| BAD | NO | YES | 12V | BROKEN | OPEN | ON | ON | NO | FAULT/STOP |
| BAD | YES | NO | 12V | BROKEN | OPEN | ON | ON | NO | FAULT/STOP |

| START MODE OF OPERATION |||||||||
|---|---|---|---|---|---|---|---|---|
| INPUT CONDITION |||| OUTPUT RESULT |||||
| S+ STATE | OVERLOAD DETECTED | LEAKAGE DETECTED | VERTM | S+ STATE | S- STATE | LEAKAGE INDICATOR | OVERAGE INDICATOR | SOURCE V PRESENT? | UNIT STATE |
| OK | NO | NO | 0V | CLOSE | CLOSE | OFF | OFF | YES | READY |
| OK | NO | NO | 0V-12V | CLOSE | CLOSE | OFF | OFF | YES | RUN |
| BAD | NO | NO | 0V | BROKEN | OPEN | ON | ON | NO | FAULT/STOP |
| BAD | NO | NO | 0V-12V | BROKEN | OPEN | ON | ON | NO | FAULT/STOP |

FIG. 7

| STOP MODE OF OPERATION |||||||||
|---|---|---|---|---|---|---|---|---|
| INPUT CONDITION |||| OUTPUT RESULT |||||
| S+ STATE | OVERLOAD DETECTED | LEAKAGE DETECTED | VERTM | S+ STATE | S- STATE | LEAKAGE INDICATOR | OVERAGE INDICATOR | SOURCE V PRESENT? | UNIT STATE |
| BAD | NO | NO | 12V | BROKEN | CLOSE | ON | ON | YES | RUN |
| BAD | NO | NO | 12V-0V | BROKEN | OPEN | ON | ON | NO | FAULT/STOP |

FIG. 8

APPARATUS AND METHOD FOR DETECTING CURRENT OVERLOAD AND LEAKAGE IN A TRANSPORT REFRIGERATION UNIT

TECHNICAL FIELD OF THE DISCLOSED EMBODIMENTS

The presently disclosed embodiments generally relate to transport refrigeration units, and more particularly, to an apparatus and method for detecting of current overload and leakage in transport refrigeration units.

BACKGROUND OF THE DISCLOSED EMBODIMENTS

Certain freight, such as fruits, vegetables, meat, or other perishable goods generally require being kept at cool or frozen temperatures during transport in an effort to keep such freight "fresh." Typically, a refrigeration unit is attached to a container that is used to store the freight during transport. Accordingly, the refrigeration unit can be used control a temperature of the environment within the container. For example, a semi-trailer is typically used to haul large amounts of freight from one location to another. In such applications, transport refrigeration units are typically mounted to an external side (e.g., front, back, side, top, or underside) of the semi-trailer in order to control the temperature of the environment therein.

To control the temperature, the transport refrigeration units include a refrigerant vapor compression system, which require power. Typically, the power is provided by the operation of a heat engine designed to convert one form of energy (e.g., heat/thermal energy) into mechanical energy to do mechanical work. Accordingly, the output mechanical energy may be used to drive an electric generator (e.g., a generator shaft of the electric generator), which in turn generates electrical power for driving a component of the refrigerant vapor compression system, such as a compressor motor.

As with any wiring and electrical circuitry, faults can occur. Such faults may include ground faults, short circuit faults, open circuit faults, or any other type of abnormal operation of the circuitry affecting the flow of current therethrough. As such, various technologies have been developed, such as circuit breakers, to protect an electrical circuit from damage caused by such faults. However, present passive protection technologies may not respond properly under certain conditions, which can present safety concerns. Therefore, there is a need for an improved apparatus and method for the detection of current overload and leakage in transport refrigeration units.

SUMMARY OF THE DISCLOSED EMBODIMENTS

One aspect comprises a method for active detection of current overload and leakage by an overload and active fault detection circuit of a transport refrigeration unit, the method comprising: measuring, by a microcontroller of the active fault detection circuit, a line current for each of one or more phases output by a generator of the transport refrigeration unit supplying power to a load of a refrigerant vapor compression system of the transport refrigeration unit; measuring, by the microcontroller, a voltage received by the active fault detection circuit from a battery of the transport refrigeration unit and transmitted via a conductor of the active fault detection circuit to a microprocessor of the refrigerant vapor compression system; controlling, by the microcontroller, a switch along the conductor of the active fault detection circuit to control transmission of the voltage, via the conductor to the microprocessor, wherein controlling the switch comprises (i) closing the switch upon a determination that the voltage level is greater than or equal to an operational threshold voltage level, (ii) closing the switch upon a determination that the voltage level is less than the operational threshold voltage level, and (iii) opening the switch upon a determination that any of the one or more line currents exceeds a threshold.

In some embodiments, opening the switch upon the determination that any of the one or more line currents exceeds the threshold comprises (i) determining whether any of the line currents exceed a line current threshold and (ii) opening the switch upon a determination that any of the one or more line currents exceeds the line current threshold.

In other embodiments, line current threshold is approximately 40 Amps.

In yet other embodiments, wherein opening the switch upon the determination that any of the one or more line currents exceeds the threshold comprises (i) determining whether a sum of the one or more line currents exceeds a line current threshold and (ii) opening the switch upon a determination that the sum of the one or more line currents exceeds the leakage current threshold.

In other embodiments, leakage current threshold is approximately 100 mA.

In yet other embodiments, the method further comprises determining whether the switch is operating correctly, wherein controlling the switch further comprises opening another switch positioned along the conductor and upstream of the switch upon a determination that the switch is not operating correctly.

In another embodiment, determining whether the switch is operating correctly comprises comparing a present state of the switch to an expected state of the switch, wherein the expected state of the switch is based on the voltage, and wherein the present state of the switch is one of an open state or a closed state.

BRIEF DESCRIPTION OF THE DRAWINGS

The embodiments and other features, advantages and disclosures contained herein, and the manner of attaining them, will become apparent and the present disclosure will be better understood by reference to the following description of various exemplary embodiments of the present disclosure taken in conjunction with the accompanying drawings, wherein:

FIG. 6 is an illustrative table describing the relationship between input conditions detected by the illustrative overload and current leakage detection circuit of FIG. 4 and the output results initiated by the overload and current leakage detection circuit during run time of the transport refrigeration unit of the system of FIG. 1;

FIG. 7 is an illustrative table describing the relationship between input conditions detected by the illustrative overload and current leakage detection circuit of FIG. 4 and the output results initiated by the overload and current leakage detection circuit during starting of the transport refrigeration unit of the system of FIG. 1; and FIG. 8 is an illustrative table describing the relationship between input conditions detected by the illustrative overload and current leakage detection circuit of FIG. 4 and the output results initiated by the overload and current leakage detection circuit during stopping of the transport refrigeration unit of the system of FIG. 1.

DETAILED DESCRIPTION OF THE DISCLOSED EMBODIMENTS

Figure 1:
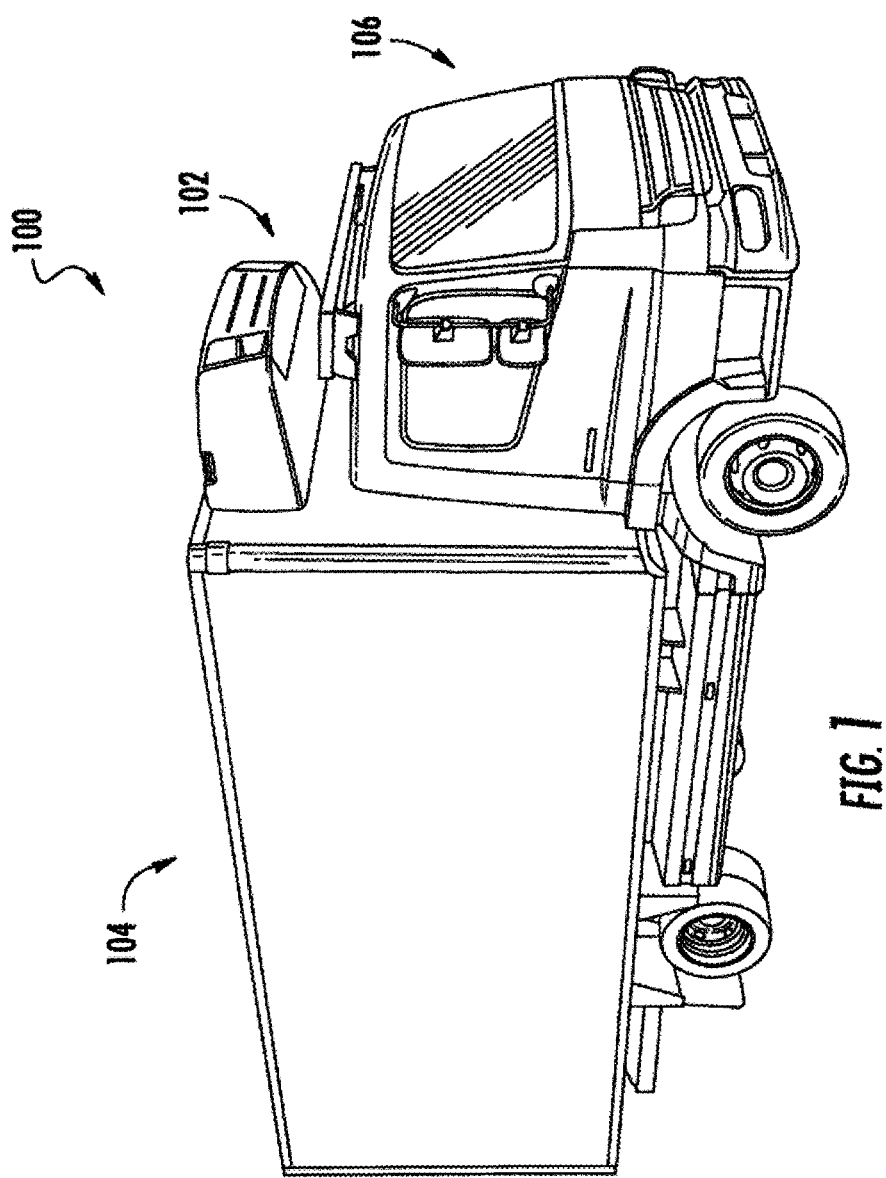
FIG. 1 is a diagram of an illustrative refrigerated transport system for thermal event detection that includes a transport refrigeration unit mounted on a semi-trailer.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 illustrates a refrigerated transport system 100 that includes a transport refrigeration unit 102. In the illustrative refrigerated transport system 100, the transport refrigeration unit 102 is mounted to an exterior of a container 104. In use, the transport refrigeration unit 102 is usable to cool the atmosphere within the container 104, and thereby the freight transported therein. Such freight may include fruits, vegetables, meat, or other perishable goods that are intended to be kept fresh or frozen. The illustrative container 104 comprises a semi-trailer upon which the transport refrigeration unit 102 is mounted to an exterior wall thereof, such that the container 104 can be used to carry freight when attached to a tractor unit 106; however, it should be appreciated that the container 104 may be embodied as any type of enclosure, in other embodiments.

To cool the atmosphere within the container 104, the transport refrigeration unit 102 includes a refrigerant vapor compression system (see, e.g., the refrigerant vapor compression system 212 of FIG. 2) that is powered by a power system. Typically, the power is provided by the operation of an engine (see, e.g., the engine 202 of FIG. 2) designed to convert one form of energy (e.g., heat/thermal energy) into mechanical energy to do mechanical work. Accordingly, the output mechanical energy may be used to drive a generator (see, e.g., the generator 204 of FIG. 2) via a generator shaft of the generator, which in turn generates electrical power for driving a load (see, e.g., the load 208 of FIG. 2). However, certain operational conditions can result in the generator pulling too much current (i.e., current overload) or current flowing through a protective ground conductor to ground (i.e., leakage current).

Accordingly, present technologies have been developed to measure current levels between the generator and the load. Illustratively, referring now to FIG. 2, an engine 202 is mechanically coupled to a generator 204. The engine 202 may be embodied as any type of internal combustion engine in which the combustion of fuel occurs with an oxidizer (e.g., atmospheric oxygen) in a combustion chamber to apply direct force to some component of the engine 202 (e.g., a clutch (not shown)), moving said component over a distance and thereby transforming chemical energy into useful mechanical energy (i.e., to provide power to the refrigerant vapor compression system 212). For example, the engine 202 may be embodied as, but not limited to, a reciprocating engine (e.g., a compression-ignition engine, a spark-ignition engine, etc.), a combustion turbine (e.g., a gas turbine engine), etc.

The generator 204 is configured to generate power, illustratively shown as generating three-phase electric power (i.e., a set of three alternating-current (AC) electrical currents). The generator 204 may be embodied as any type of electric generator capable of converting mechanical energy into electrical energy for use in an external circuit to perform the functions described herein. As illustratively shown, the three-phase electric power is transmitted via a set of three current carrying phase conductors 206 (e.g., a wire for each phase of AC) to a load 208 of the refrigerant vapor compression system 212.

The load 208 may include one or more components of the refrigerant vapor compression system 212, such as a compressor motor, a battery charger, a heater, a fan, etc., which are not shown to preserve clarity of the description. To monitor the current being drawn by the load 208, a fault detection circuit 210 measures the flow of electric charge across each of the conductors 206. Additionally, the fault detection circuit 210 is configured to control the voltage supplied to the refrigerant vapor compression system 212 (e.g., via the battery 216). The illustrative refrigerant vapor compression system 212 includes a microprocessor 214 configured to control the operations of the components of the refrigerant vapor compression system 212 (e.g., a compressor, a condenser, an expansion device, an evaporator, refrigerant lines, etc.) which are not shown to preserve clarity of the description. It should be appreciated that the microprocessor 214 is configured to control said operations based on the voltage supplied to the refrigerant vapor compression system 212 via the fault detection circuit 210.

The microprocessor 214 may be embodied as any combination of software, firmware, hardware, and/or circuitry that is capable of performing the functions described herein. For example, the microprocessor 214 may be embodied as a single system-on-a-chip (SoC) on a single integrated circuit (IC) with one or more CPUs or processor cores, memory (e.g., program memory, random-access memory (RAM), etc.), and programmable input/output (I/O) peripherals.

The fault detection circuit 210 is communicatively coupled to an on-board diagnostics (OBD) unit 218. Accordingly, the fault detection circuit 210 can transmit a notification (e.g., via a data packet) to the OBD unit 218 upon detection of a fault (e.g., a current overload or a ground fault). The OBD unit 218 may be embodied as any combination of hardware, software, and/or firmware capable of performing self-diagnostic and providing status feedback to an operator (e.g., a driver, a technician, etc.) of the refrigerated transport system 100.

Figure 4:
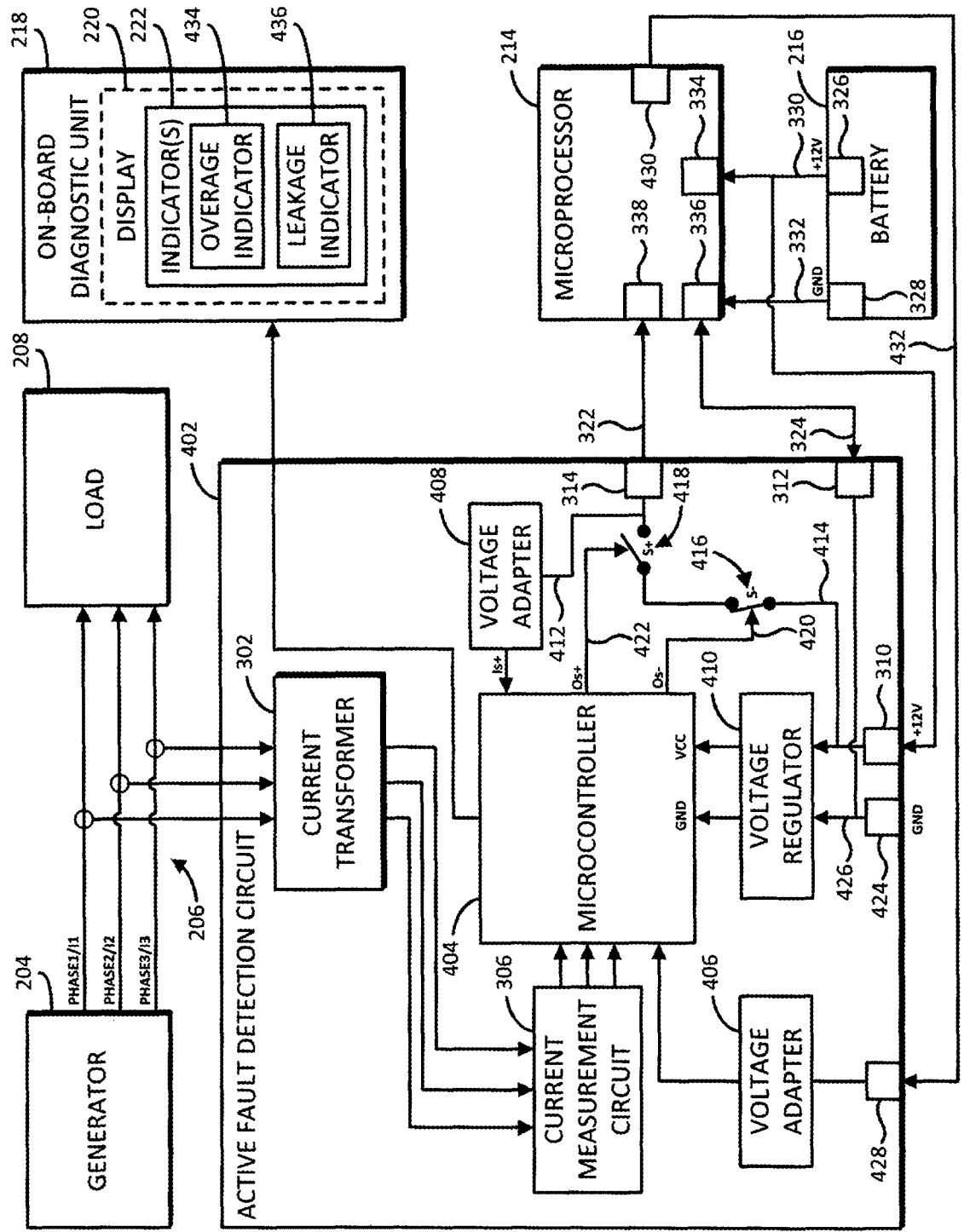
FIG. 4 is a block diagram of an illustrative embodiment of an overload and current leakage detection circuit.

In some embodiments, the illustrative OBD unit 218 may include a display 220 capable of displaying one or more one or more indicator elements 222 (e.g., graphics on a display, one or more light-emitting diodes, etc.) to provide a visual indication of the status of the respective component(s). In such embodiments, the notification transmitted by the fault detection circuit 210 may be usable by the OBD unit 218 to indicate to the operator via one or more indicator elements 222 that a fault has been detected in the transport refrigeration unit 102. Alternatively, in other embodiments, the one or more indicator elements 222 may be coupled directly (i.e., "on") the active fault detection circuit 402 (as shown in FIG. 4).

Figure 2:
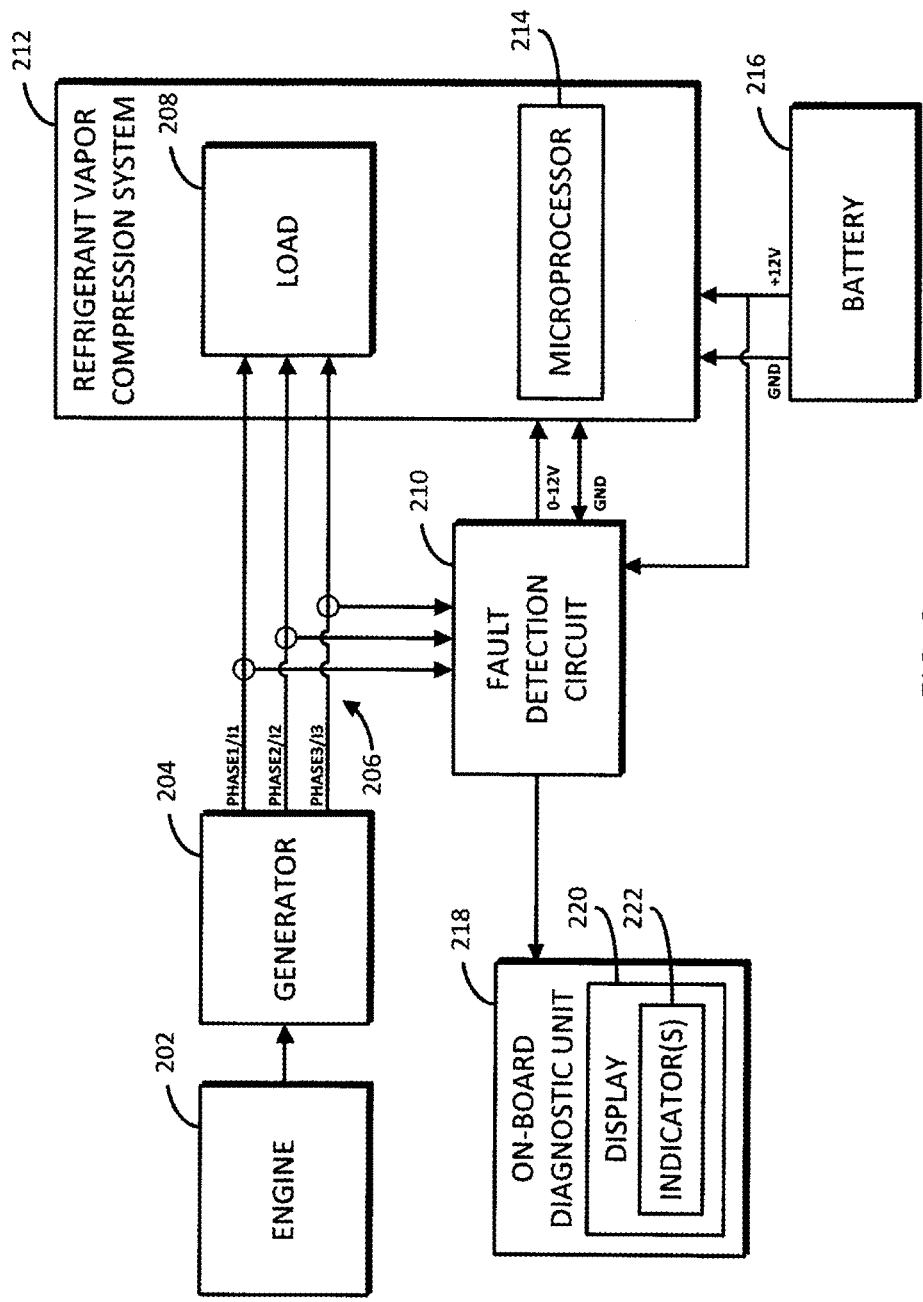
FIG. 2 is a block diagram of a power system of the transport refrigeration unit of FIG. 1 electrically coupled to a refrigerant vapor compression system of the transport refrigeration unit via a fault detection circuit.

In the illustrative embodiment of FIG. 2, each of the fault detection circuit 210 and the refrigerant vapor compression system 212 are electrically coupled to a battery 216. The battery 216 is configured to provide power (e.g., starting power) to one or more accessory electrical devices (not shown) of the transport refrigeration unit 102. While the illustrative battery 216 is shown as a 12 Volt battery, it should be appreciated that, in other embodiments, the battery 216 may be configured to provide another voltage level. Additionally, it should be appreciate that, while the battery 216 is referred to herein as a 12 Volt battery, the actual or resting state of charge of the battery 216 may be greater than 12 Volts (e.g., 12.4 Volts, 12.8 Volts, etc.) depending on the level of charge of the battery 216.

Figure 3:
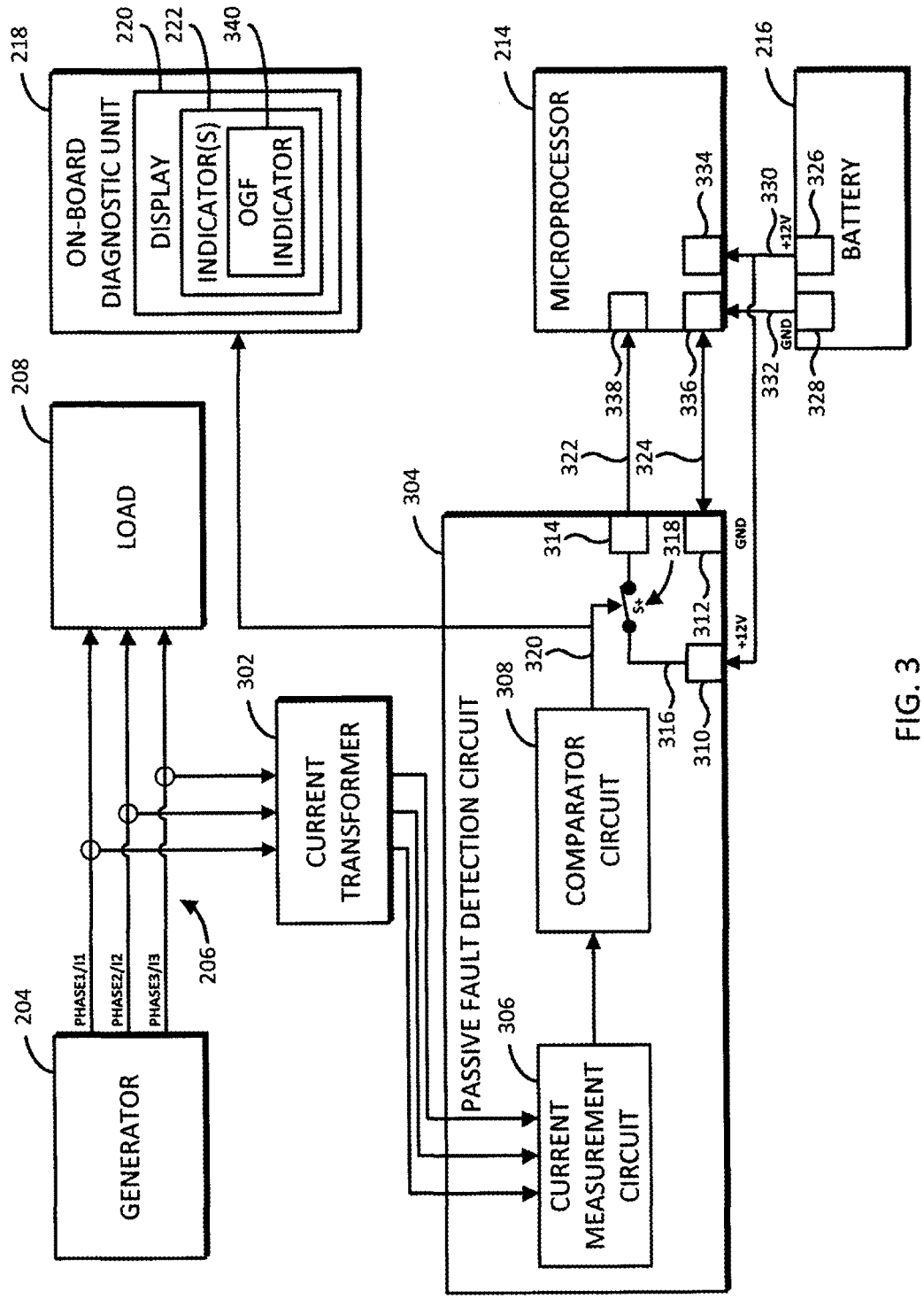
FIG. 3 is a block diagram of an illustrative embodiment of a typical fault detection circuit.

Referring now to FIG. 3, a typical passive fault detection circuit 304 is configured to detect current overload and ground faults. To do so, the passive fault detection circuit 304 includes a current measurement circuit 306 and a comparator circuit 308. The current measurement circuit 306 may be embodied as any type of instrument transformer usable to measure the flow of current across each current conductor 206 to which the current measurement circuit 306 is connected. The levels of the currents flowing through the lines 206 may be stepped down by a current transformer 302 to levels that are compatible with the circuitry of the current measurement circuit 306. The comparator circuit 308 may be embodied as any type of comparator device usable to compare two current levels and output a digital signal indicating which of the current levels is larger. It should be appreciated that the two current levels may consist of a current level (either a single phase current level or a sum current level of all phases) and a threshold current level.

The illustrative passive fault detection circuit 304 additionally includes a voltage source terminal 310, a ground terminal 312, and a voltage output terminal 314. The voltage source terminal 310 is electrically coupled to a voltage source terminal 326 of the battery 216 via a conductor 330. The ground terminal 312 is electrically coupled to a ground terminal 328 of the battery 216 through terminal 336 of the refrigerant vapor compression system 212 and conductor 332. The illustrative refrigerant vapor compression system 212 includes a voltage source terminal 334, a ground terminal 336, and another voltage source terminal 338. It should be appreciated that the ground terminals 312, 328, and 336 are all connected to the same electrical point (i.e., ground (GND)). Similarly, it should also be appreciated that the 310, 326, and 334 are all connected to the same electrical point (i.e., the 12 Volt power supply (+12V)).

As illustratively shown, a conductor 332 connects the ground terminal of the battery 216 and the ground terminal 336 of the refrigerant vapor compression system 212, and the ground terminal 336 of the refrigerant vapor compression system 212 is connected to the ground terminal 312 of the passive fault detection circuit 304 via conductor 324. The source voltage received by the passive fault detection circuit 304 from the battery 216 is transmitted across a conductor 316 to the voltage output terminal 314. The conductor 316 includes a switch 318 that is controlled by an output of the comparator circuit 308 via conductor 320. Accordingly, when the switch 318 is closed, the path is complete and voltage may flow therethrough. Conversely, continuity across the conductor 316 may be broken if the switch 318 is in an open state.

In operation, the passive fault detection circuit 304 is configured to open the switch 318 if a fault is detected. For example, the passive fault detection circuit 304 is configured to determine whether a current level (e.g., a flow of current measured across any of the phase conductors 206) is greater than a line current threshold (e.g., 40 Amps). In another example, the passive fault detection circuit 304 is configured to determine whether a sum of the currents measured across all of the phase conductors 206 (i.e., leakage current) is greater than a current leakage threshold (e.g., 100 mA).

Accordingly, upon opening the switch 318, the supply voltage will not be received by the refrigerant vapor compression system 212. The microprocessor 214, configured to measure the supply voltage and determining that no voltage is being supplied, is configured to stop the refrigerant vapor compression system 212 from operating. Additionally, an overload and ground fault (OGF) indicator 340 of the OBD unit 218 is configured to be operationally active upon detecting the same output of the comparator circuit 308 (e.g., along conductor 320), thereby providing an indication that a fault was detected.

While such fault detection may be useful, the protection is a passive protection and determining the cause of the fault could be difficult to discern based on the operational state of the refrigerant vapor compression system 212 (i.e., on or off) and the OGF indicator 340. For example, if the switch 318 is broken, the voltage supply is not transmitted to the passive fault detection circuit 304 (e.g., the power supply voltage is lost during operation), or the ground is lost on the passive fault detection circuit 304, the switch 318 remains closed. As such, if a fault (e.g., the line current is greater than the line current threshold or the leakage current is greater than a current leakage threshold) occurs during that time, the passive fault detection circuit 304 will not open the switch 318. Therefore, the microprocessor 214 of the refrigerant vapor compression system 212 will not stop the refrigerant vapor compression system 212, resulting in a safety issue. Additionally, in another example, if the switch 318 is broken in the open position, the microprocessor 214 of the refrigerant vapor compression system 212 will unnecessarily stop the refrigerant vapor compression system 212, resulting in a quality control issue.

Referring now to FIG. 4, an active fault detection circuit 402 is shown that includes the current transformer 302 and the current measurement circuit 306 of FIG. 3. The illustrative active fault detection circuit 402 includes a microcontroller 404, a voltage regulator 410, a voltage adapter 406, and a voltage adapter 408. The microcontroller 404 may be embodied as any combination of software, firmware, hardware, and/or circuitry that is capable of performing the functions described herein. For example, the microcontroller 404 may be embodied as a single system-on-a-chip (SoC) on a single integrated circuit (IC) with one or more CPUs or processor cores, memory (e.g., program memory, random-access memory (RAM), etc.), and programmable input/output (I/O) peripherals.

The voltage regulator 404 may be embodied as any type of circuitry (e.g., electromechanical mechanisms and/or electrical components) capable of stabilizing the voltage (i.e., automatically maintaining a constant voltage level) received by the voltage regulator 410 and transmitting the stabilized voltage to the microcontroller 404. The voltage adapters 406, 408 may be embodied as any type of circuitry (e.g., electromechanical mechanisms and/or electrical components) capable of changing the voltage of an electrical power source (i.e., voltage conversion).

The illustrative active fault detection circuit 402 additionally includes another ground terminal 424 which is tied to the ground terminal 312 via conductor 426, which is received as an input ground to the voltage regulator 410. Unlike the conductor 316 of FIG. 3 which connected terminal 310 with terminal 314 and included a single switch 318, a conductor 414 connects terminal 310 with terminal 314 and includes two switches, switch 416 controlled by the microcontroller 404 via conductor 420 and switch 418 controlled by the microcontroller 404 via conductor 422.

By default, the switch 418 is in an open state and the active fault detection circuit 402 is configured to open the switch 418 in response to an indication received by the voltage adapter 406 that indicates whether the is in an "on" or "off" state. To do so, the microprocessor 214 is configured to provide the microcontroller 404 with an indication of the present power state via terminal 430 of the microprocessor to terminal 428 of the active fault detection circuit 402 via conductor 432. For example, if the indication is equal to the source voltage (e.g., 12 Volts), the microcontroller 404 can make the determination that the present power state is equal to an "on" state. Similarly, if the indication is equal to no voltage (i.e., 0 Volts), the microcontroller 404 can make the determination that the present power state is equal to an "off" state.

As described previously, a fault may consist of a current overload or a leakage current issue. For example, the microcontroller 404 is configured to determine whether a current level (e.g., a flow of current measured across any of the phase conductors 206) is greater than a line current threshold (e.g., 40 Amps). In another example, the microcontroller 404 is configured to determine whether a sum of the currents measured across all of the phase conductors 206 (i.e., leakage current) is greater than a leakage current threshold (e.g., 100 mA).

Figure 5A:
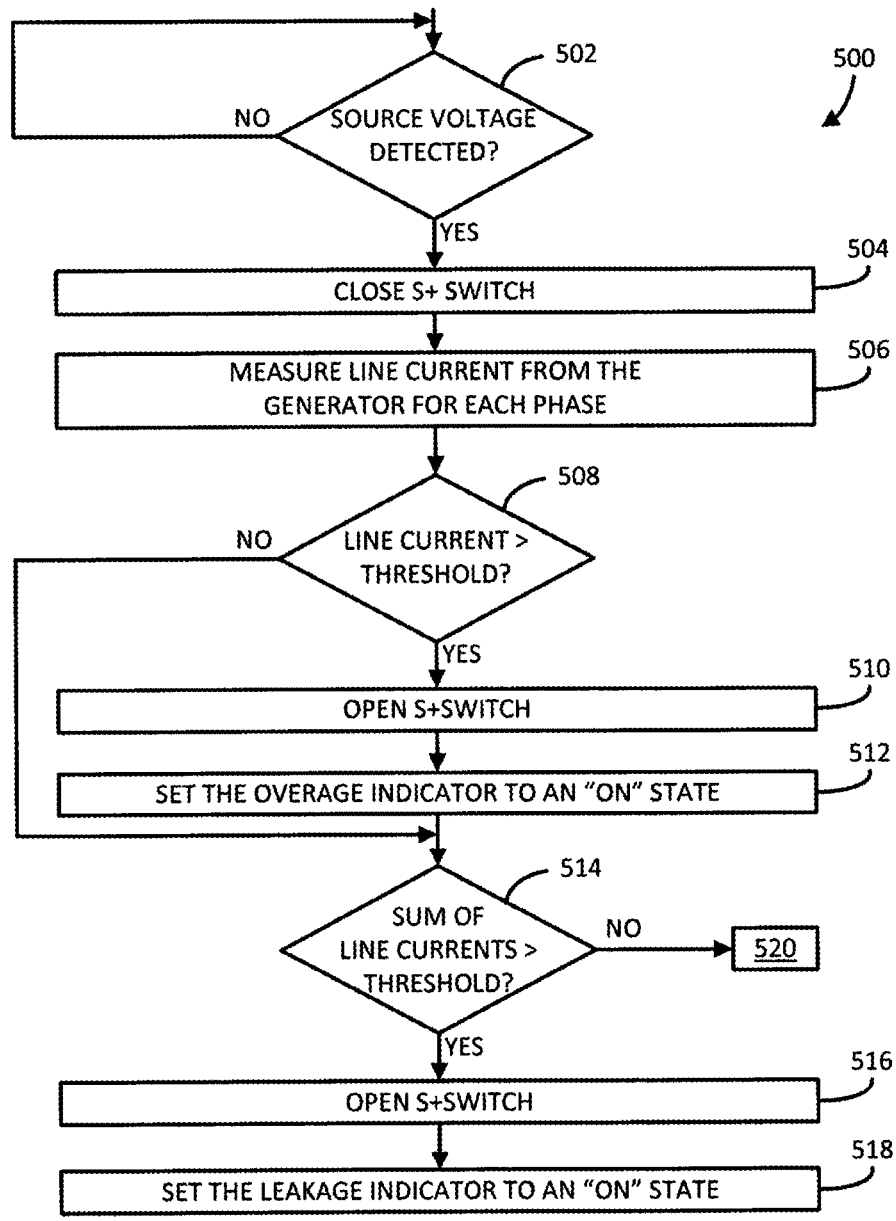
FIGS. 5A and 5B is a block flow diagram of the method for detecting current overload and leakage in the transport refrigeration unit of FIG. 1 that may be performed by a microcontroller of the overload and current leakage detection circuit of FIG. 4.
Figure 5B:
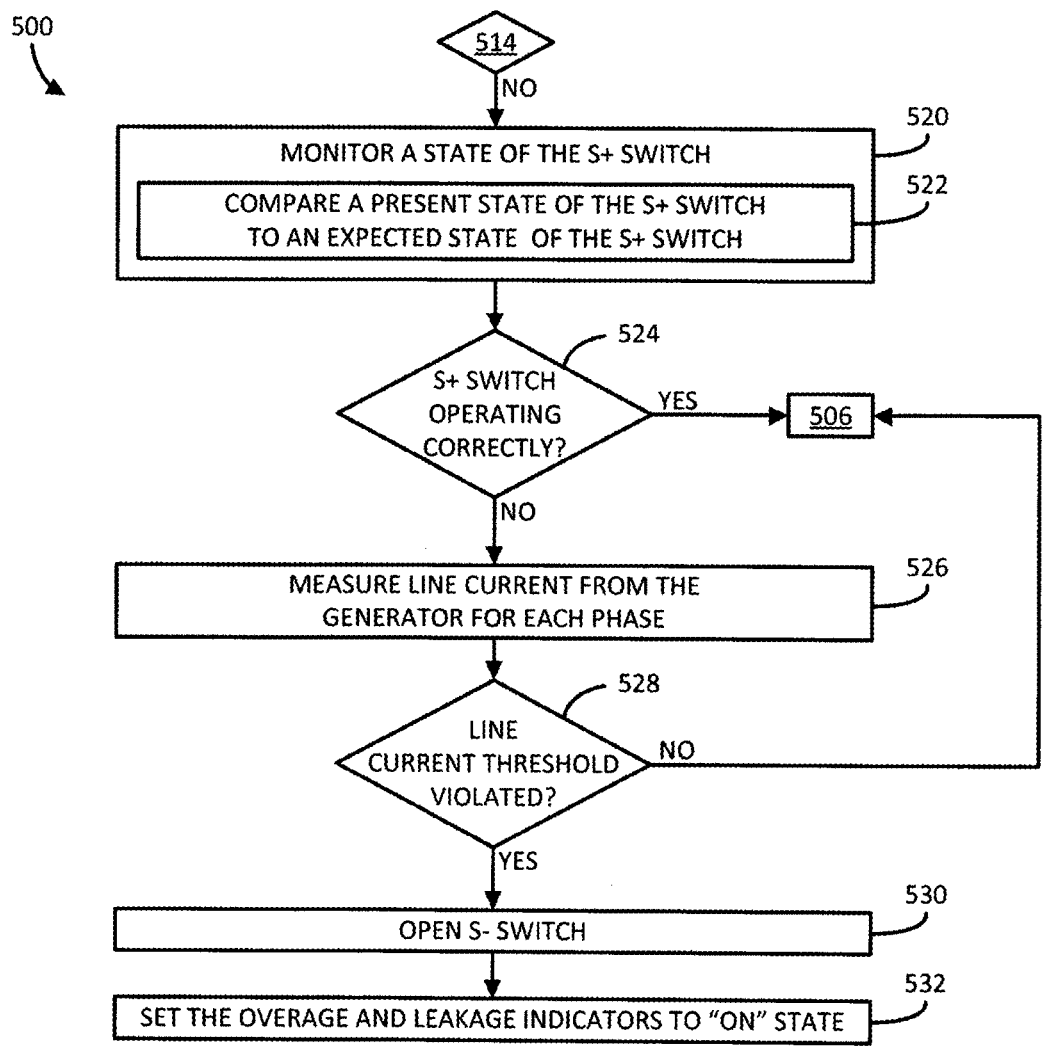

As shown in FIGS. 5A and 5B, an illustrative method 500 is provided for detecting current overload and leakage in the transport refrigeration unit 102 that may be performed by the active fault detection circuit 402, or more particularly by the microcontroller 404 of the active fault detection circuit 402. To do so, the microcontroller 404 is configured to perform various logical operations as a function of detected conditions (i.e., input conditions) during an operational mode of the refrigerant vapor compression system 212. Such input conditions are details in the illustrative tables 600, 700, 800 of FIGS. 6-8, which also show relationships between input conditions detected by the overload and current leakage detection circuit 402 and the output results (i.e., logical operations) initiated by the overload and current leakage detection circuit 402.

It should be appreciated that, as shown in the illustrative tables of FIGS. 6-8, the microcontroller 404 is configured to detect whether the switch 418 is operating correctly as a function of the operational mode of the transport refrigeration unit 102. For example, the transport refrigeration unit 102 may be operating in "running" mode as shown in table 600 FIG. 6 (i.e., the transport refrigeration unit 102 is powered on), in "starting" mode as shown in the table 700 of FIG. 7 (i.e., the transport refrigeration unit 102 is being powered on), or in "stopping" mode as shown in the table 800 of FIG. 8 (i.e., the transport refrigeration unit 102 is being powered off). As such, a user may repair the refrigerant vapor compression system 212 regardless of operational mode, potentially without the loss to the freight being transported. Accordingly, it should be further appreciated that the operations described in the method 500 may be performed irrespective of which mode Referring back to FIG. 5, the method 500 begins in block 502, in which the microcontroller 404 determines whether the source voltage is detected (i.e., the active fault detection circuit 402 is powered "on"). In other words, does the source voltage received from the battery 216, via the conductor 330, exceed an operational threshold voltage level (e.g., 12 V). To do so, the microcontroller 404 is configured to receive a signal (i.e., a voltage level signal, VERTM) from the microprocessor 214 via the conductor 432, which connects terminal 430 of the microprocessor 214 to terminal 428 of the active fault detection circuit 402. The signal may be one of "off" (e.g., 0 V), "on" (e.g., 12 V), "starting" (e.g., transitioning from 0 V to 12 V), or "stopping" (e.g., transitioning from 12 V to 0 V).

If a source voltage has been detected, the method 500 advances to block 504 in which the microcontroller 404 closes the switch 418, illustratively the S+ switch, to allow for normal starting operation(s) of the refrigerant vapor compression system 212. To do so, the microcontroller 404 activates the conductor 422, illustratively Os+. In block 506, the microcontroller 404 measures the line current (i.e., across phase conductors 206) from the generator 204 for each phase. In block 508, the microcontroller 404 determines whether one or more of the line currents are greater than a line current threshold (e.g., 40 Amps).

If so, the method 500 branches to block 510; otherwise, the method 500 branches to block 514, described below. In block 510, the microcontroller 404 opens the switch 418 (i.e., the S+ switch). As such, the voltage being supplied to the microprocessor 214 is cut-off, thereby providing an indication to the microprocessor 214 to cease operation of the refrigerant vapor compression system 212. Additionally, in block 512, the microcontroller 404 sets the overage indicator 434 to an active state (i.e., turns the overage indicator 434 "on") to indicate that the fault was detected.

As described previously, if the microcontroller 404 determines that none of the line currents is greater than the line current threshold in block 508, the method 500 branches to block 514. In block 514, the microcontroller 404 determines whether a sum of the line currents measured in block 506 is greater than a leakage current threshold. If not, the method 500 branches to block 520, described below; otherwise, the method 500 branches to block 516. In block 516, the microcontroller 404 opens the switch 418 (i.e., the S+ switch). Accordingly, the voltage being supplied to the microprocessor 214 is cut-off, thereby providing an indication to the microprocessor 214 to cease operation of the refrigerant vapor compression system 212. Additionally, in block 518, the microcontroller 404 sets the leakage indicator 436 to an active state (i.e., turns the leakage indicator 436 "on") to indicate that the fault was detected.

As described previously, if the microcontroller 404 determines that the sum of the line currents measured in block 506 is not greater than the leakage current threshold, the method 500 branches to block 520. In block 520, shown in FIG. 5B, the microcontroller 404 monitors the state of the switch 418 (i.e., the S+ switch). For example, in block 522, the microcontroller 404 compares a present state of the switch 418 to an expected state of the switch 418 (e.g., to determine whether a short has been detected). In other words, the microcontroller 404 determines the present operation mode of the refrigerant vapor compression system 212 (i.e., whether the refrigerant vapor compression system 212 is in an "on," "off," "starting," or "stopping" state). To determine the present state of the switch 418, the microcontroller 404 detects a voltage level on the output side of the switch 418 via the conductor 412 and the voltage adaptor 408 (illustratively Is+). To determine the expected state of the switch 418, the microcontroller 404 detects the expected state of the switch 418 as a function of the source voltage detected in block 502 described above.

In block 524, the microcontroller 404 determines whether the switch 418 is operating correctly. In other words, the microcontroller 404 determines whether, as a result of the comparison performed in block 522, the present state of the switch 418 corresponds to the expected state of the switch 418. For example, if the microcontroller 404 detects the switch 418 is not functioning properly (e.g., open when it should be closed or vice versa), such as may be attributable to a short, the method 500 branches to block 526; otherwise, the method 500 returns to block 506. In block 526, the microcontroller 404 measures the line current (i.e., across phase conductors 206) from the generator 204 for each phase, similar to block 506. In some embodiments, the results of the measurement performed in block 506 may be used in block 528, thereby eliminating the need for block 526 in such embodiments. In block 528, the microcontroller 404 determines whether a current threshold has been violated. In other words, the microcontroller 404 determines whether the switch 418 should be in an open state as a result of the result of block 508 (i.e., whether one or more of the line currents are greater than a line current threshold) or block 514 (i.e., whether a sum of the line currents is greater than a leakage current threshold).

If the microcontroller 404 determined in block 528 that a current threshold has not been violated, the method 500 returns to block 506; otherwise, the method 500 advances to block 530, in which the microcontroller 404 opens the switch 416, illustratively the S− switch. Accordingly, the voltage being supplied to the microprocessor 214 is cut-off, thereby providing an indication to the microprocessor 214 to cease operation of the refrigerant vapor compression system 212. Additionally, in block 532, the microcontroller 404 sets both the overage indicator 434 and leakage indicator 436 to an active state (i.e., turns the overage indicator 434 "on" and the leakage indicator 436 "on") to indicate that an issue with the switch 418 was detected.

In some embodiments, the leakage current threshold comparison of block 514 may be performed before the line current threshold comparison of block 508 or in parallel thereto. Accordingly, it should be appreciate that, in such embodiments, the microcontroller 404 may be configured to monitor the switch 418 to determine whether the switch is operating correctly (e.g., block 524) subsequent to determining the comparisons made in block 508 and 514 regardless of the order of operations.

While the illustrative embodiment is directed towards a transport refrigeration unit application, it should be appreciated that the features described herein may be implemented in other applications in which such thermal events may occur and detection thereof may be relevant. Additionally, while the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A method for active detection of current overload and leakage by an overload and active fault detection circuit of a transport refrigeration unit (TRU), the method comprising:
   measuring, by a microcontroller of the active fault detection circuit, a line current for each of one or more phases output by a generator of the TRU supplying power to a load of a refrigerant vapor compression system of the TRU;
   measuring, by the microcontroller, a voltage received by the active fault detection circuit from a battery of the TRU and transmitted via a conductor of the active fault detection circuit to a microprocessor of the refrigerant vapor compression system;
   controlling, by the microcontroller, a switch along the conductor of the active fault detection circuit to control transmission of the voltage, via the conductor to the microprocessor,
   wherein controlling the switch comprises (i) closing the switch upon a determination that the transportation refrigeration unit is operating in a run mode of operation and the voltage level is greater than or equal to an operational threshold voltage level, (ii) closing the switch upon a determination that the transportation refrigeration unit is operating in a start mode of operation and the voltage level is less than the operational threshold voltage level, and (iii) opening the switch upon a determination that any of the one or more line currents exceeds a threshold.

2. The method of claim 1, wherein opening the switch upon the determination that any of the one or more line currents exceeds the threshold comprises (i) determining whether any of the line currents exceed a line current threshold and (ii) opening the switch upon a determination that any of the one or more line currents exceeds the line current threshold.

3. The method of claim 2, wherein the line current threshold is approximately 40 Amps.

4. The method of claim 1, wherein opening the switch upon the determination that any of the one or more line currents exceeds the threshold comprises (i) determining whether a sum of the one or more line currents exceeds a leakage line current threshold and (ii) opening the switch upon a determination that the sum of the one or more line currents exceeds the leakage current threshold.

5. The method of claim 4, wherein the leakage current threshold is approximately 100 mA.

6. The method of claim 1, further comprising determining whether the switch is operating correctly, wherein controlling the switch further comprises opening another switch positioned along the conductor and upstream of the switch upon a determination that the switch is not operating correctly.

7. The method of claim 6, wherein determining whether the switch is operating correctly comprises comparing a present state of the switch to an expected state of the switch, wherein the expected state of the switch is based on the voltage, and wherein the present state of the switch is one of an open state or a closed state.

* * * * *